United States Patent [19]

Hara

[11] Patent Number: 5,739,174
[45] Date of Patent: Apr. 14, 1998

[54] EPOXYSILICONE PHOTOCURABLE COMPOSITION COMPRISING A SULFOLENE OR ISATIN PHOTOSENSITIZER

[75] Inventor: Fujio Hara, Hachioji, Japan

[73] Assignee: Minnesota Mining and Manufacturing Company, St. Paul, Minn.

[21] Appl. No.: 648,046

[22] PCT Filed: Nov. 21, 1994

[86] PCT No.: PCT/US94/13638

§ 371 Date: May 17, 1996

§ 102(e) Date: May 17, 1996

[87] PCT Pub. No.: WO95/16722

PCT Pub. Date: Jun. 22, 1995

[30] Foreign Application Priority Data

Dec. 15, 1993 [JP] Japan ................................ 5-314734

[51] Int. Cl.$^6$ .............................. C08G 65/16; C08G 77/14
[52] U.S. Cl. ........................ 522/25; 522/26; 522/27; 522/170; 522/148; 528/21; 528/23; 528/40
[58] Field of Search ........................... 522/25, 26, 172, 522/31, 27, 63, 68, 148, 170, 84; 528/21, 23, 33, 40

[56] References Cited

U.S. PATENT DOCUMENTS

| | | | |
|---|---|---|---|
| 3,428,590 | 2/1969 | Yamase | 260/67 |
| 3,756,827 | 9/1973 | Chang | 96/86 |
| 3,915,824 | 10/1975 | McGinniss | 2/50 |
| 4,172,157 | 10/1979 | Nowak | 427/54 |
| 4,600,436 | 7/1986 | Traver | 106/3 |

FOREIGN PATENT DOCUMENTS

| | | | |
|---|---|---|---|
| 0143315 | 10/1984 | European Pat. Off. | C09G 1/16 |
| 0330406 | 2/1989 | European Pat. Off. | C08F 8/00 |
| 0501055A1 | 3/1991 | European Pat. Off. | C09D 1/00 |
| 0524524A1 | 7/1992 | European Pat. Off. | C08J 7/04 |

OTHER PUBLICATIONS

ACS Abstract 119:96239 CA, Polymerization of methyl methacrylate using *isatin* and benzoyl peroxide combination as *photoinitiator*, Som Pranab Kumar, Eur. Polym. J. (1993), 29(6), 899–92.

Japanese Patent Abstract, publication No. JP58149042, publication date May 9, 1983, Yamamoto Chiyou.

*Primary Examiner*—Susan W. Berman
*Attorney, Agent, or Firm*—Janice L. Dowdall

[57] ABSTRACT

A photocurable composition comrpising: (a) a photopolymerizable silane or siloxane containing epoxycylohexyl group(s), (b) a photoinitiator, and (c) a photosensitizer, wherein the photosensitizer comprises at least one material selected from the group consisting of sulfolene, sulfolene derivatives, isatin and isatin derivatives.

7 Claims, No Drawings

EPOXYSILICONE PHOTOCURABLE COMPOSITION COMPRISING A SULFOLENE OR ISATIN PHOTOSENSITIZER

This application is a 371 of PCT/U.S. Pat. No. 94/13,638, filed Nov. 21, 1994.

TECHNICAL FIELD

The present invention relates to a photocurable composition, and in particular, to a photocurable composition preferably employed for a luster agent for coating an automobile body and the like, including, for example, a coated surface of an automobile, a plastic bumper, and a tire.

BACKGROUND ART

Conventionally, a wax such as carnuba wax, polyethylene wax, a silicone such as dimethyl polysiloxane, and a variety of modified silicones, and the like, have been employed as a luster agent for use on the exterior of an automobile. However, these luster agents do not impart sufficient gloss, water repellency and stain resistance, and have poor durability.

Although employment of a polymerized wax or silicone has been proposed in order to improve durability of a luster agent, such techniques can diminish the waxing processability of the luster composition. Thus, photocurable compositions mentioned below have been proposed.

Japanese Patent Kokai Publication No. S51-134794 disclose a visible light curable composition comprising an epoxy resin, an aryl halonium salt and an organic dye. The epoxy resin disclosed in the reference may be obtained from a reaction of bisphenol A with epichlorohydrin. However, the epoxy resin itself shows no gloss nor stain resistance, and it hardly be used as a luster agent.

A UV curable silicone releasing composition having epoxy and/or acrylic functionality, which is disclosed in Japanese Patent Kokai Publication S58-213024, cannot be employed as a luster agent, since the resin is designed to function as a releasing agent.

A UV curable organopolysiloxane composition disclosed in Japanese Patent Kokai Publication H4-33960 comprises a organopolysiloxane having both acrylic and epoxy functionality, and a specific sulfonate photoinitiator. Even though the composition is photocured in the presence of air as a luster agent, oxygen contained in the air affects and makes the surface of the coating tacky, and the resulting coating lacks durability. Further, another problem is presented in that a UV (i.e., ultraviolet light) irradiation apparatus is needed for the composition.

DESCRIPTION OF THE INVENTION

The present invention overcomes the above described prior art problems while providing a specific photocurable composition which is curable by using a visible as well as UV light. The photocurable composition shows remarkably good properties when it is employed as a luster agent.

The present invention relates to a photocurable composition comprising: (a) a photopolymerizable monomer or oligomer comprising an organopolysiloxane having an epoxy or vinyl group; (b) a photoinitiator; and (c) a photosensitizer, wherein the photosensitizer comprises at least one material seleted from the group consisting of sulfolene; sulfolene substituted by an alkyl group of 1–5 carbon atoms, an alkoxy group of 1–5 carbon atoms, halogen, a cyano group, an amino group or a phenyl group; isatin, and isatin substituted by an alkyl group of 1–5 carbon atoms, an alkoxy group of 1–5 carbon atoms, halogen, a cyano group, an amino group or a phenyl group.

A photopolymerizable monomer or oligomer employed in the present invention includes a monomeric or oligomeric compound having any one or both of an epoxy group and a vinyl group.

Photopolymerizable monomers or oligomers comprising organopolysiloxanes having an epoxy group or a vinyl group are preferred. The organopolysiloxane may be prepared by hydrosilyl-addition of an epoxy compound to an organopolysiloxane having a n-SiH bond. Alternatively, the organopolysiloxane may be prepared by hydrosilyl-addition of an ω-haloolefin to an organopolysiloxane having a n-SiH bond, and then, replacing the halogen with an acrylate in the presence of a base, according to a procedure disclosed in Japanese Patent Kokai Publication No. S58-213024. However, an organopolysiloxane having an epoxy group is preferred as the photopolymerizable compound, because it is not affected by oxygen.

Examples of suitable organopolysiloxanes having an epoxy group are those represented by the following general formulae I, II, and III.

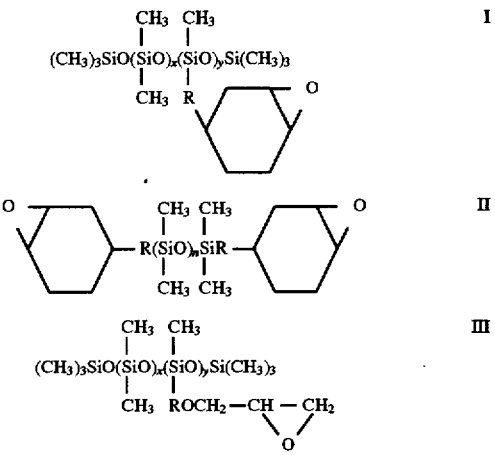

In formulae I, II, and III, x has a value of 0 to 100; y has a value of 1 to 100; and n has a value of 0 to 100. If x or n is 0, then the molecule has a hydrogen atom or other monovalent substituent bonded to the Si atom in the remaining structure in place thereof. The group R is a divalent linking group having 1 to 10 carbon atoms. For example, group R can be a substituted or unsubstituted alkylene group having 1 to 10 carbon atoms. The R group is preferably aliphatic. Examples of such alkylene groups for group R include methylene, ethylene, propylene and butylene, and so forth.

The compounds of formulae I, II and III can be used solely or in combinations thereof without limitation. The compounds of formulae I, II and III contemplated for the present invention preferably have a viscosity of $10^{-3}$–$10^2$ pas at 25° C. and an epoxy equivalent of $10^2$–$10^4$. An alicyclic epoxy-modified organopolysiloxane, such as represented by formulae I, II, and III, is very useful due to its high reactivity.

Alternatively, as the photopolymerizable compound having a vinyl group, suitable compounds include an alkyl (meth)acrylate such as methyl (meth)acrylate, ethyl (meth) acrylate, propyl (meth)acrylate, 2-ethylhexyl (meth) acrylate, n-butyl (meth)acrylate and the like; and another vinyl compound such as styrene, α-methyl styrene, N-vinyl carbazole, isobutyl vinyl ether, vinyl acetate and vinyl pyrrolidone; and the like.

The photoinitiator employed in the present invention is not particularly limited as long as it is a photoinitiator which initiates a polymerization of the above-described epoxy group or vinyl group upon exposure to light. A preferred photoinitiator employed in the present invention includes an onium salt, since a cation polymerization can be carried out by using the onium salt. In general, any onium salt conventionally used as a photoinitiator can be employed. Specific examples of the onium salt include triphenylsulfonium hexafluoroantimonate, bis(dodecylphenyl)iodonium hexafluoroantimonate, diphenyliodonium hexafluorophosphate, di-4,4-dimethylphenyliodonium hexafluoroacetate and the like. A particularly preferred onium salt employed in the present invention is triphenylsulfonium hexafluoroantimonate because of its high reactivity.

The photoinitiator of the present invention is employed in an amount 0.1 to 50 parts, preferably 0.5 to 10 parts, by weight, based on 100 parts by weight of the photopolymerizable monomer or oligomer. If an amount of the photoinitiator is less than 0.1 parts by weight, a durable luster coating may not be provided due to an insufficient initiation of polymerization. If an amount of the photoinitiator is more than 50 parts by weight, a film strength of the resulting cured coating may become poor.

A photosensitizer employed in the present invention is at least one material selected from the group consisting of sulfolene, sulfolene derivatives, isatin, and isatin derivatives.

Sulfolene is a compound of the general formula:

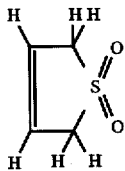

The sulfolene derivatives include a sulfonene compound having at least one of the hydrogen atoms substituted to provide a substituent bonded to the cyclic moiety of the sulfolene. Examples of such substituents include an alkyl group of 1-5 carbon atoms, an alkoxy group of 1-5 carbon atoms, halogen, a cyano group, an amino group, a phenyl group, and the like.

Isatin is a compound of the general formula:

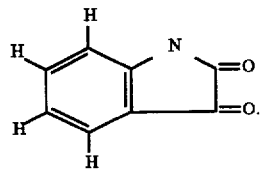

The isatin derivatives include an isatin compound having at least one of the hydrogen atoms substituted to provide a substituent bonded to the cyclic moiety of the isatin. Examples of such substituents include an alkyl group of 1-5 carbon atoms, an alkoxy group of 1-5 carbon atoms, halogen, a cyano group, an amino group, a phenyl group, and the like.

The photosensitizer of the present invention, such as sulfolene and isatin and derivatives thereof may be employed alone or in combination with each other and/or in combination with additional photosensitizers, such as anthraquinone.

The photosensitizer of the present invention is employed in an amount 1 to 200, preferably 10 to 50 parts by weight based on 100 parts by weight of a photoinitiator. If an amount of the photosensitizer is less than 1 part by weight, a sensitizing function may become insufficient. If an amount of the photosensitizer is more than 200 parts by weight, latency of the photosensitizer may become poor, a breakage during storage may occur, and a cost of the composition way become high.

A composition of the present invention itself is a photocurable composition for use in a variety of applications, and exhibits superior curability to visible light irradiation. A photocurable composition of the present invention may be formulated as an emulsion by using an emulsifier, however it is most preferable that a photocurable composition of the present invention is used as a luster agent for use in an automobile.

An emulsifier employed includes a negative ionic, positive ionic, nonionic and amphoteric emulsifiers such as a salt of fatty acid, an ester of fatty acid, and fluorine or silicone class emulsifier. An emulsifier of the present invention is employed in an amount of 1 to 100, preferably 5 to 50 parts by weight based on 100 parts by weight of a photopolymerizable monomer or oligomer.

An aqueous medium may be employed in combination with an emulsifier. A water miscible organic solvent and/or water were generally used as an aqueous medium. Examples of the aqueous medium include an alcohol such as methanol, ethanol, isopropyl alcohol, glycerol and ethylene glycol, an ether such as dimethyl ether, diethyl ether, methyl cellosolve and ethyl cellosolve, a ketone such as acetone, methyl ethyl ketone, methyl isobutyl ketone, and the like. An amount of the aqueous medium employed is not limited, but may be used in an amount of 0.1 to 50 parts by weight based on 100 parts by weight of water.

A luster agent comprising a photocurable composition of the present invention exhibits remarkably good lustering ability, gloss, water repellency and stain resistance and durability, when it is applied in a thickness of 0.01 to 5 μm on an automobile body or exterior part as the substrate. These and other aspects of the invention are further illustrated by the following nonlimiting examples.

EXAMPLES AND COMPARATIVE EXAMPLES

Solvent based photocurable compositions were prepared by blending components indicated in Table 1. The resulting compositions were coated on test-pieces in thickness of 1 μm by using a buff made of sponge.

The test piece was a cold rolled steel panel on which an acrylic urethane paint (Nax BESTA available from Nippon Paint Co., Ltd.) was coated.

The resulting coatings were photocured by using a halogen lamp of 300 watts in power at a distance of 20 cm for Examples 1 and 2 and Comparative Examples 1 and 2, or with direct sunlight for Example 3 and 4 and Comparative Examples 3 and 4. The time to cure for each sample was indicated in Table 1.

A 20° gloss of each sample, which is prepared by coating the resulting composition on a color sample available from Murakami Color Materials Co., was determined according to JIS 8741. A stain resistance was then evaluated by the following procedure. A sample for evaluating stain resistance was aged outdoor for two weeks at first; the sample was then wiped with a clean cloth; and thereafter a residue of a mud stain was determined. In the following summarized examples, "organopolysiloxane 1" was an alicyclic epoxy silicone having a viscosity of 8 pas and an epoxy equivalent of 4000 available from Toray Dow Corning Silicone K.K. under the tradename "BY16-839", and "organopolysiloxane 2" was an alicyclic epoxy silicone having a viscosity of 0.03 pas and an epoxy equivalent of 600–700 obtained from Shinetsu Chemical Co., Ltd. under the tradename "X-22-169AS". The results are summarized in Table 1.

TABLE 1

|  | Examples | | | | Comparative Examples | | | |
| --- | --- | --- | --- | --- | --- | --- | --- | --- |
|  | 1 | 2 | 3 | 4 | 1 | 2 | 3 | 4 |
| organopoly-siloxane 1 | 100 | 100 | — | 50 | 100 | 100 | 100 | 100 |
| organopoly-siloxane 2 | — | — | 100 | 50 | — | — | — | — |
| initiator[1] | 3 | 3 | 3 | 3 | 3 | 3 | 3 | 3 |
| sulfolene | 1 | — | 1 | 1 | — | — | — | — |
| isatin | — | 1 | — | — | — | — | — | — |
| camphor-quinone | — | — | — | — | 1 | — | 0.5 | — |
| anthraquinone | — | — | — | — | — | 0.5 | 0.5 | — |
| acridine orange | — | — | — | — | — | — | — | 1 |
| methyl cellosolve | 25 | 25 | 25 | 25 | 25 | 25 | 25 | 25 |
| time to cure (min.) | 1 | 1.5 | 1.5 | 1 | 3 | 3 | 5 | 3 |
| 20° gloss | 68 | 65 | 70 | 65 | 65 | 64 | 65 | 69 |
| stain resistance[2] | ◯ | ◯ | ◯ | ◯ | ◯ | ◯ | ◯ | ◯ |

[1] ø₃SSbF₆, where ø means phenyl.
[2] "◯" means acceptable and "good".

What is claimed is:

1. A photocurable composition comprising:

(a) a photopolymerizable compound of the formula I or II

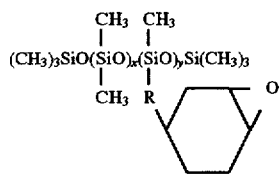

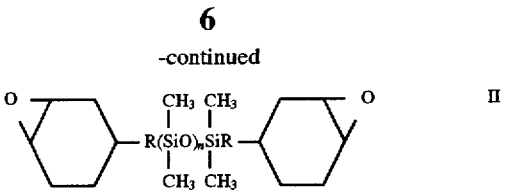

wherein x and n each independently has a value of 0 to 100;

y has a value of 1 to 100; and R is a divalent linking group having 1 to 10 carbon atoms;

(b) a photoinitiator; and (c) a photosensitizer, wherein the photosensitizer comprises at least one material selected from the group consisting of sulfolene, sulfolene substituted by an alkyl group of 1–5 carbon atoms, an alkoxy group of 1–5 carbon atoms, halogen, a cyano group, an amino group or a phenyl group; isatin, and isatin substituted by an alkyl group of 1–5 carbon atoms, an alkoxy group of 1–5 carbon atoms, halogen, a cyano group, an amino group or a phenyl group.

2. The photocurable composition according to claim 1, wherein said photosensitizer is contained in an amount of 1 to 200 parts by weight based on 100 parts by weight of said photoinitiator.

3. The photocurable composition according to claim 1, wherein said photoinitiator is contained in an amount 0.1 to 50 parts, by weight, based on 100 parts by weight of said photopolymerizable monomer or oligomer.

4. The photocurable composition according to claim 1, wherein said photoinitiator comprises an onium salt.

5. The photocurable composition according to claim 4, wherein said onium salt is selected from the group consisting of triphenylsulfonium hexafluoroantimonate, bis(dodecylphenyl)iodonium hexafluoroantimonate, diphenyliodonium hexafluorophosphate, and di-4,4-dimethylphenyliodonium hexafluoroacetate.

6. The photocurable composition according to claim 4, wherein said onium salt comprises triphenylsulfonium hexafluoroantimonate.

7. The photocurable composition according to claim 1, wherein said photocurable composition further comprises an emulsifier compound, and said photocurable composition is in an emulsion form.

* * * * *